United States Patent [19]

Hermansdorfer

[11] 3,959,742

[45] May 25, 1976

[54] OSCILLATING APPARATUS

[75] Inventor: James E. Hermansdorfer, Charlottesville, Va.

[73] Assignee: Sperry Rand Corporation, New York, N.Y.

[22] Filed: Apr. 14, 1975

[21] Appl. No.: 567,794

[52] U.S. Cl. ............................... 331/111; 331/153
[51] Int. Cl.$^2$ ........................................ H03K 3/353
[58] Field of Search ........... 331/111, 172, 173, 174, 331/145, 149, 153

[56] References Cited
UNITED STATES PATENTS

| | | | |
|---|---|---|---|
| 2,980,863 | 4/1961 | Hussey | 331/111 |
| 3,287,663 | 11/1966 | Steen | 331/111 |
| 3,316,477 | 4/1967 | Shrider et al. | 331/111 |
| 3,365,651 | 1/1968 | Rolfes | 331/111 |
| 3,562,628 | 2/1971 | Barber | 331/172 |

Primary Examiner—John Kominski
Attorney, Agent, or Firm—Howard P. Terry; Seymour Levine

[57] ABSTRACT

An oscillating apparatus allowing for synchronization to an external sinusoidal source, and in which a unidirectional element is so located that the oscillating device may be replaced without the necessity of altering circuit elements to maintained synchronization and the desired nominal frequency of operation.

4 Claims, 1 Drawing Figure

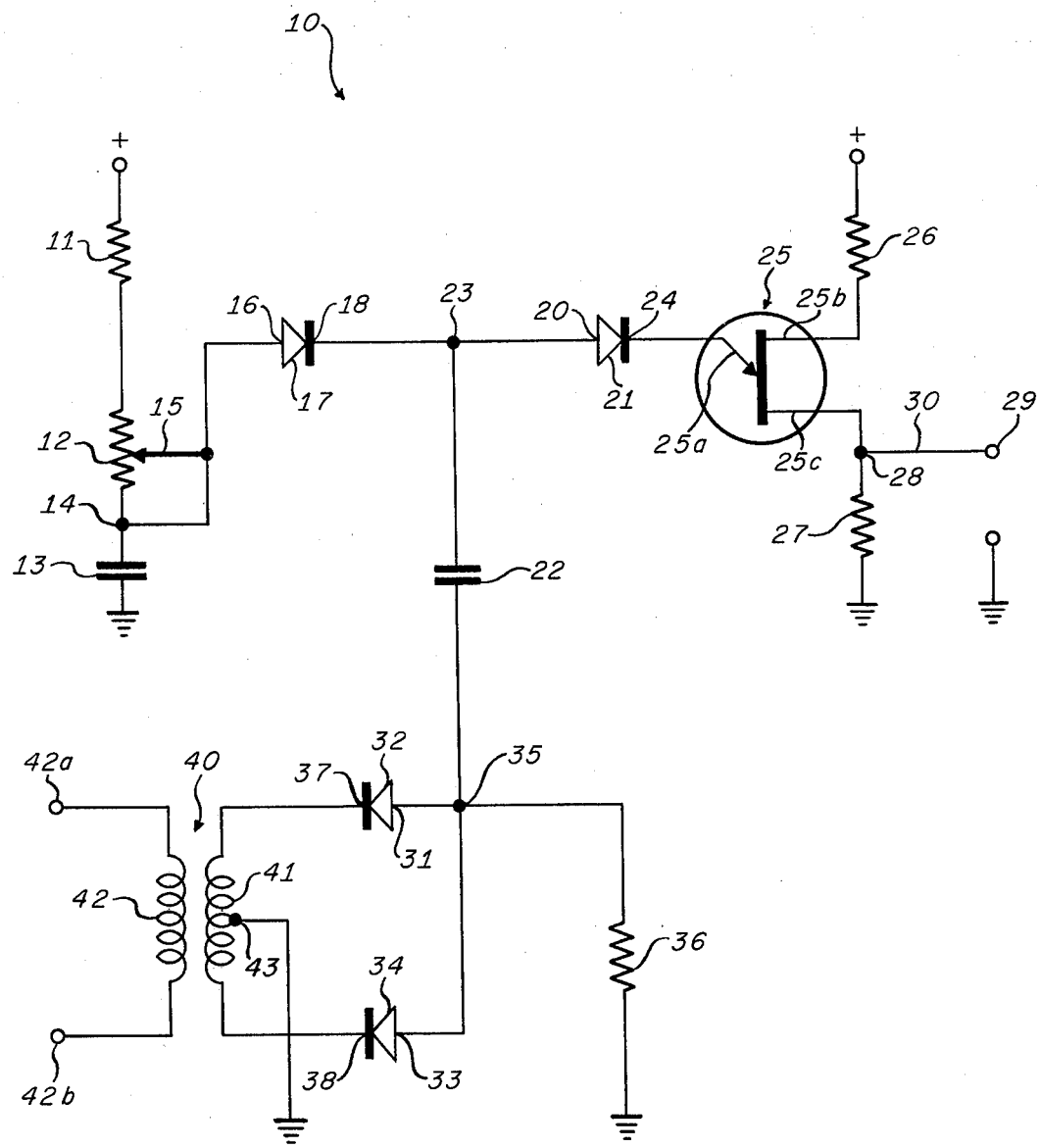

OSCILLATING APPARATUS

BACKGROUND OF THE INVENTION

1. Field of the Invention

The invention relates to relaxation oscillators and, more particularly, to relaxation oscillators which are synchronized to an external source.

2. Description of the Prior Art

Prior art designs of astable relaxation oscillators have employed external sources for controlling the operating frequency. This synchronization is readily accomplished with sinusoidal oscillators as the external source only over a narrow band of frequencies wherein the ratio of the nominal frequency of the relaxation oscillator to the frequency of the injected signal is a ratio of integers.

When the synchronizing source is not applied, the astable relaxation oscillator may continue to operate at a nominal frequency which is determined by the circuit values and the characteristics of the oscillating element. The period of this nominal frequency includes the interval during which the capacitor of the timing circuit charges to the firing voltage of the transistor employed as the oscillating device. Though this interval is essentially determined by the time constant of the timing circuit and the firing voltage of the transistor, it is modified by the current leakage at the transistor electrode to which the capacitor is connected. Since the leakage and firing voltage vary significantly between transistors of the same type, the replacement of the transistor generally alters the nominal frequency of the oscillator.

SUMMARY OF THE INVENTION

In accordance with the present invention there is provided a relaxation oscillator, which may employ a unijunction (UJT) transistor as the oscillating element, that can be synchronized to an external sinusoidal source within a synchronization frequency band that is greater than plus or minus 10%, which is appreciably larger than previously obtainable. The circuitry also provides a means for isolating the UJT from the other circuit elements that allows normal operation of the circuit as a relaxation oscillator and further allows for the replacement of the UJT, the leakage current of which may vary from that of other UJT's of the same type, without significantly altering the frequency of operation of the circuit.

BRIEF DESCRIPTION OF THE DRAWINGS

This invention is illustrated in the single drawing, a schematic of the sinusoidally synchronized relaxation oscillator.

DESCRIPTION OF THE PREFERRED EMBODIMENT

Referring to the FIGURE, there is shown a sine wave synchronized relaxation oscillator 10, including a resistor 11, having a first terminal coupled to a positive d.c. source (not shown) and a second terminal coupled to a first terminal on a potentiometer 12, which has its second terminal connected to a first terminal on a capacitor 13 at a node 14. The wiper arm 15 of the potentiometer 12 is connected to node 14 and to the anode 16 of diode 17. The cathode 18 of diode 17 is connected to the anode 20 of diode 21 and to a first terminal on a capacitor 22 at a node 23. The cathode 24 of diode 21 is coupled to the emitter 25a of a UJT 25, the first ohmic contact 25b of which is coupled to a positive d.c. source (not shown), which may be the same source previously indicated, via a resistor 26. The second ohmic contact 25c of UJT 25 is coupled to a first terminal on a resistor 27 at a node 28 which is connected to an output terminal 29 via conductor 30, while the second terminal of the resistor 27 is connected to ground. The second terminal of the capacitor 22 is connected to the anode 31 of a diode 32 and to the anode 33 of a diode 34 at a node 35 which is coupled to ground via a resistor 36. Cathode 37 of the diode 32 and cathode 38 of the diode 34 are connected to a transformer 40 at opposite terminals of the secondary winding 41, the center tap of which is grounded via a conductor 43. The opposite terminals 42a and 42b of the primary winding 42 of transformer 40 are the input terminals for the synchronizing sinusoidal source (not shown).

When the positive d.c. supply voltages are applied to the oscillator 10, the emitter junction 25a of UJT 25 is reverse-biased and UJT is not conducting. The capacitor 13 then charges through the series connected resistor 11 and potentiometer 12 while the capacitor 22, which in the absence of a synchronizing signal is coupled to ground via the diodes 32 and 34 and the grounded center tap 43 of the secondary winding 41 of the transformer 40, charges through the resistor 11, the potentiometer 12 and the diode 17. The capacitors 13 and 22 charge in parallel and the voltage at node 23 rises exponentially towards the level of the positive d.c. source with a time constant that is determined by the capacitor 22 and the timing circuit which includes the resistor 11, the potentiometer 12, and the capacitor 13. When the potential at node 23, that acts as a timing signal, becomes greater than the potential at the emitter 25a of UJT 25, the diode 21 conducts applying the potential at node 23 to the emitter 25a. Upon reaching a predetermined potential, established by the characteristics of the transistor 25, known as the peak voltage, the emitter 25a causes UJT 25 to conduct, and the parallel combination of the capacitors 13 and 22 discharges through the UJT 25 and the resistor 27, establishing a voltage at the node 28 which is transmitted via the conductor 30 to the output terminal 29. The capacitors 13 and 22 continue to discharge in this fashion until the voltage at the emitter 25a reaches a minimum voltage whereupon the cycle repeats. The nominal period of this cycle is determined by the values of the resistors 11 and 27, the capacitors 13 and 22, and the setting of the potentiometer 12.

The diodes 17 and 21 perform a steering function directing the discharge of the capacitors 13 and 22 to the emitter 25a of UJT 25. Though diodes 17 and 21 are utilized in the preferred embodiment, the steering function may be performed by any unidirectional device. In addition, the diode 21 performs an isolation function that prevents current leakage through the emitter 25a from charging capacitor 22 which would cause erratic operation. This isolation permits the replacement of UJT 25 with another UJT of the same type, whose characteristics may differ somewhat from the previous UJT, and still maintain the same frequency of operation without the alteration of circuit component values other than a minor adjustment of potentiometer 12 to compensate for a change in the peak voltage.

When a sinusoidal synchronizing source is applied to terminals 42a and 42b, of the primary winding 42 of transformer 40, the rectifying circuit comprising the resistor 36, the diodes 32 and 34 and the transformer 40 causes a negative full wave rectified voltage at the node 35. This rectified voltage is applied to node 23 via the capacitor 22 and is added to the potential at the node 23 created by charging the capacitors 13 and 22. The summed potential at the node 23 is applied to the emitter 25a of UJT 25, reaching the peak voltage of UJT 25 at some phase of the sinusoidal synchronizing source whereupon UJT 25 conducts and a cycle of the relaxation oscillator is initiated, with the operation continuing as previously described.

The diodes 32 and 34 convert the sinusoidal synchronization signal to a pulsed signal for which synchronization results only when the synchronizing signal frequency is equal to or higher than the nominal frequency of the relaxation oscillator. However, when the synchronizing frequency is lower than the nominal frequency of the relaxation oscillator, the average charge on capacitor 22 will decrease the charged potential at node 23, causing the relaxation oscillator to operate at a new nominal frequency that is lower than the original. This decrease in nominal frequency permits the relaxation oscillator to be synchronized to a lower external frequency than was required for the original nominal frequency.

For each cycle of operation the peak voltage is reached at the same phase of the sinusoidal synchronizing source, thus locking the relaxation oscillator frequency to the frequency of the synchronizing source. This synchronization is accomplished when the frequency of the synchronizing source is at least within plus or minus 10% of the free running frequency of the relaxation oscillator 10, as determined by the resistor 27, capacitor 22, and the timing circuit which includes the resistor 11, the potentiometer 12, and the capacitor 13.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An oscillating apparatus comprising:
   timing means for providing timing signals;
   a first unidirectional current conductive means having an input terminal and an output terminal, coupled to said timing means at said input terminal, and so poled that currents are conducted from said input terminal to said output terminal;
   a second unidirectional current conductive means, having an input terminal and an output terminal, said input terminal coupled to said output terminal of said first unidirectional current conductive means thereby forming a first node;
   a first capacitor, having a first terminal and a second terminal, said first terminal coupled to said first node, said first capacitor with said timing means determining a timing signal at said first node;
   means coupled to said second terminal of said first capacitor for supplying synchronizing signals so that the sum of said timing signals and said synchronizing signals exists at said first node; and
   oscillating means, coupled to said output terminal of said second unidirectional current conductive means, for causing oscillations having a frequency dependent on said sum of said timing and synchronizing signals at said first node.

2. An oscillating apparatus in accordance with claim 1 wherein said timing means comprises:
   means for applying a positive d.c. source;
   a resistor having a first terminal and a second terminal, said first terminal coupled to said source means;
   a second capacitor, having a first terminal and a second terminal, said first terminal connected to said second terminal of said resistor and to said input terminal of said first unidirectional current conductive means and said second terminal coupled to ground.

3. An oscillating apparatus in accordance with claim 1 wherein said synchronizing means comprises:
   a transformer having a primary winding and a secondary winding, said primary providing the input for synchronizing signals and said secondary winding having first and second terminals and a grounded center tap;
   first rectifying means having a first terminal and a second terminal, said first terminal coupled to said first terminal of said secondary winding and so poled that current flows towards said first terminal of said secondary winding;
   second rectifying means having a first terminal coupled to said second terminal of said secondary winding, and a second terminal connected to said second terminal of said first rectifying means forming a second node which is coupled to said second terminal of said first capacitor; and
   a resistor having a first terminal coupled to ground and a second terminal coupled to said second node whereby the output signal of said synchronizing means appears at said second node and coupled via said first capacitor to said first node.

4. An oscillating apparatus in accordance with claim 1 wherein said oscillating means includes a unijunction transistor.

* * * * *